United States Patent [19]

Eichelberger et al.

[11] Patent Number: 4,546,473
[45] Date of Patent: Oct. 8, 1985

[54] RANDOM PATTERN SELF TEST DESIGN

[75] Inventors: Edward B. Eichelberger, Hyde Park; Eric Lindbloom, Poughkeepsie, both of N.Y.

[73] Assignee: International Business Machines Corporation, Armonk, N.Y.

[21] Appl. No.: 492,288

[22] Filed: May 6, 1983

[51] Int. Cl.[4] .......................................... H03K 19/177
[52] U.S. Cl. ........................................ 371/25; 371/15
[58] Field of Search ............................ 371/21, 25, 15; 364/716; 340/825.83

[56] References Cited

U.S. PATENT DOCUMENTS

| | | | |
|---|---|---|---|
| 3,958,110 | 5/1976 | Hong et al. | 371/15 |
| 4,418,410 | 11/1983 | Goetze et al. | 371/15 |
| 4,435,805 | 3/1984 | Hsieh et al. | 371/25 |
| 4,461,000 | 7/1984 | Young | 371/21 |

FOREIGN PATENT DOCUMENTS 82107302.0  3/1983  European Pat. Off.

OTHER PUBLICATIONS

Fujiwara, A Design of PLAs with Universal Tests, IEEE Transactions on Circuits and Systems, Vol. CAS 28, No. 11, 11/81, pp. 1027–1032.
Eichelberger and Lindbloom, Random-Pattern Coverage Enhancement and Diag. for LSSD Logic & Self Test, IBM J. Res. Develop., vol. 27, No. 3, 5/83, pp. 265–272.
Wu, Pretesting Laserable PLA Peripheral Circuits, IBM Technical Disclosure Bulletin, vol. 22, No. 5, 10/79, pp. 1866–1869.
Daehn et al., A Hardware Approach to Self-Testing of Large PLAs, IEEE Trans. on Circuits & Systems, vol. CAS-28, No. 11, 11/81, pp. 1033–1037.

Primary Examiner—Jerry Smith
Assistant Examiner—M. E. Ungerman
Attorney, Agent, or Firm—W. S. Robertson

[57] ABSTRACT

A PLA is constructed to improve random testing. Section circuits are provided that permit disabling sections of the output lines that are called segments so that the circuit can be tested one segment at a time. Selection circuits are also provided for enabling the product term lines only one at a time. Thus, while random test signals are conventionally applied to the PLA input terminals for test, only a small portion of the PLA is enabled for the test. Control signals for the selection circuits are generated randomly so that the portion of the PLA that is tested is varied randomly.

7 Claims, 2 Drawing Figures

RANDOM PATTERN SELF TEST DESIGN

FIELD OF THE INVENTION

This invention relates to a circuit device for performing digital logic functions and more specifically it relates to a device such as a programmable logic array (PLA) with means to make the device more easily testable.

RELATED PUBLICATIONS

Our new circuit device is described in the *IBM Journal of Research and Development,* May 1983, which is incorporated by reference.

INTRODUCTION

In a familiar method for testing a logic and/or storage circuit, known inputs are applied to the device under test and the output of the device is compared with the output that is known to be correct if the device does not have a fault. A device can be thought of as having a number of states that are each defined by a unique combination of input signals if the device is arranged so that internal storage devices do not multiply the number of states. If the device is not too complex, it is possible to test the device exhaustively in every possible state.

However, complex devices may have too many states for exhaustive testing. In one technique for testing a very complex device, random test signals are applied to the input terminals. The signals at some signal points of the device are applied to a coding circuit that produces a bit sequence that is a logic function of all the preceding signals. The coding circuit can also be included as part of the device. If the output of the coding circuit does not match the expected output for a device with no fault, the device is rejected.

The test signals can be "random" in the sense of random numbers that are generated by a processor according to an algorithm. Test signals are also called random if the signals are chosen on some basis that assures that some kinds of tests are made exhaustively. For example, the test inputs can be chosen to assure that each gate is opened and closed even though not all of the inputs to each gate will be raised and lowered.

A fault may be apparent in one state of the device but not be apparent in certain other states. As a relevant example, consider an OR-Invert gate with just two inputs, designated A and B. In a test in which input A is raised, the output is correctly down regardless of the logic value of input B. If input B is stuck up or stuck down, this fault will not be apparent in the operation that has just been described, either in a test or in an actual operation. Of course, the fault at input B would be discovered by creating a second test state in which input A would be down and input B should be up and creating a third test state in which both A and B should be down. For a complex device it may not be possible to provide all possible tests as was done in this simplified example.

If a device has two or more faults, it is possible in a random test that one fault will mask the other. In actual operation the device may enter an untested state where one of the faults cause an error. One object of this invention is to provide a new and improved circuit device in which these faults can be more readily found during test, and this problem will be described in detail later.

Logic circuits often contain redundant elements. Redundant elements do not adversely affect normal operation, but they add to the possibility that a fault will be masked during test and thus will not be detected, but that the fault will cause an error during normal operation. Another object of this invention is to provide a new PLA that permits improved random testing where a fault may be masked by redundant circuit elements.

This invention is particularly intended to improve random tests for a PLA or analogous circuit device. PLAs are well known, and a summary description will be presented later.

SUMMARY OF THE INVENTION

Our invention provides a PLA (or more generally, an array logic device) that is more readily testable by random test methods. The random test signals themselves may be conventional or they may be modified to take advantage of aspects of the new PLA.

According to one feature of this invention, the input lines of a PLA are controlled to be enabled for normal operation or to be enabled only in selected segments for testing. In the specific example that will be described later, a segment is one-quarter of the input lines. Segmenting the input lines isolates the segment under test from faults in a segment that is not enabled for the test. Thus, segmenting makes faults more readily apparent during a test.

According to a second feature of this invention, means is provided to selectively enable the product term lines that internally interconnect the input lines and the output lines of the array.

Means is provided for applying random signals to control both the input segmenting circuit and the product term line enabling circuit. Thus, a random data test is applied to a randomly defined section of the array. In the preferred embodiment of the invention, a random section has a single product term line and several input lines.

THE DRAWINGS

THE PREFERRED EMBODIMENT

1. Sign Conventions

In order to illustrate how faults can be masked in testing a conventional PLA and how they are unmasked in the PLA of this invention, it will be convenient to consider one specific PLA example with specific device types and specific polarities which are of course entirely arbitrary. The binary states of a signal line will be called arbitrarily "up" and "down" or 1 and 0 respectively, and the corresponding switching operations will be called "raise" and "lower". From the standpoint of the circuit potentials, "down" will be a circuit reference voltage down and "up" will be a positive voltage designated V. Variations in these examples and in this terminology will be readily apparent.

2. Conventional Features—FIGS. 1 and 2

Figure 1:
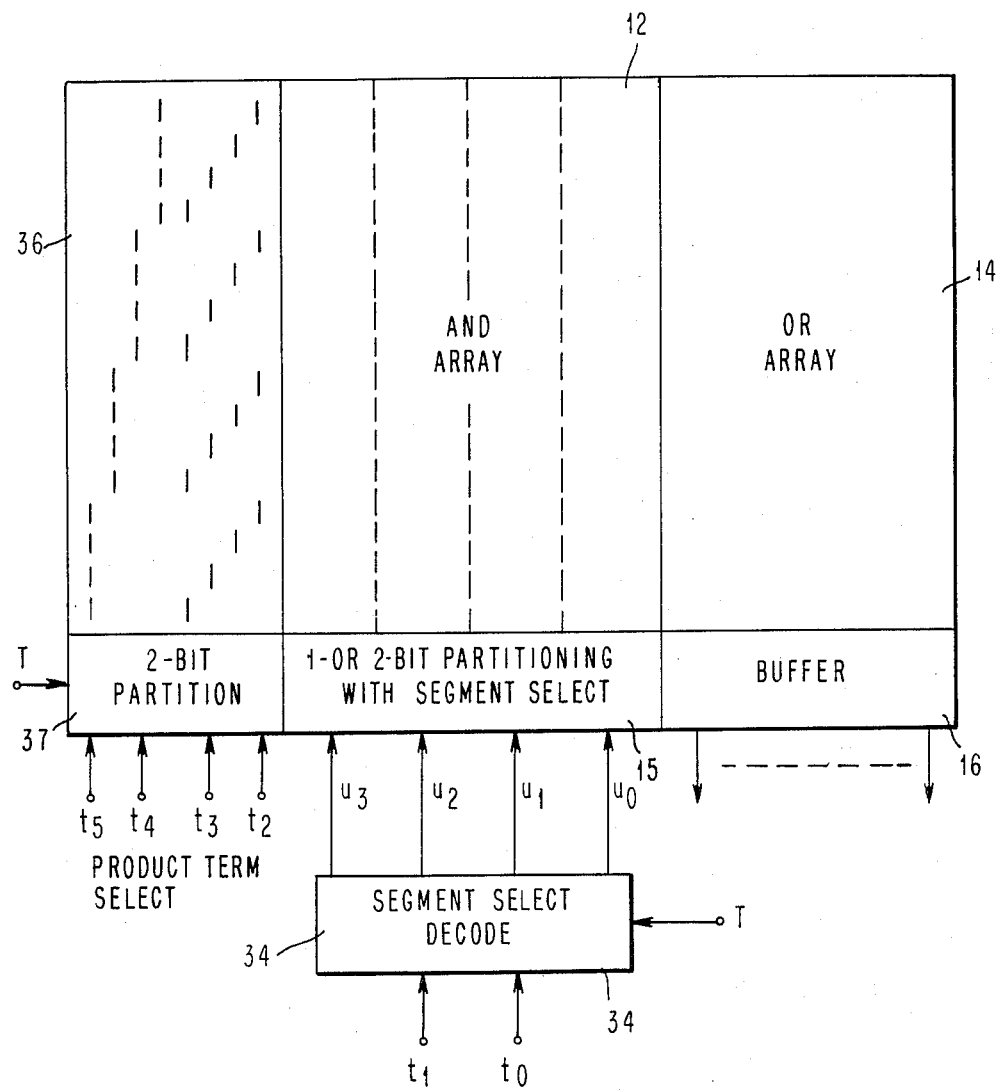
FIG. 1 is a block diagram of the PLA of this invention.
Figure 2:
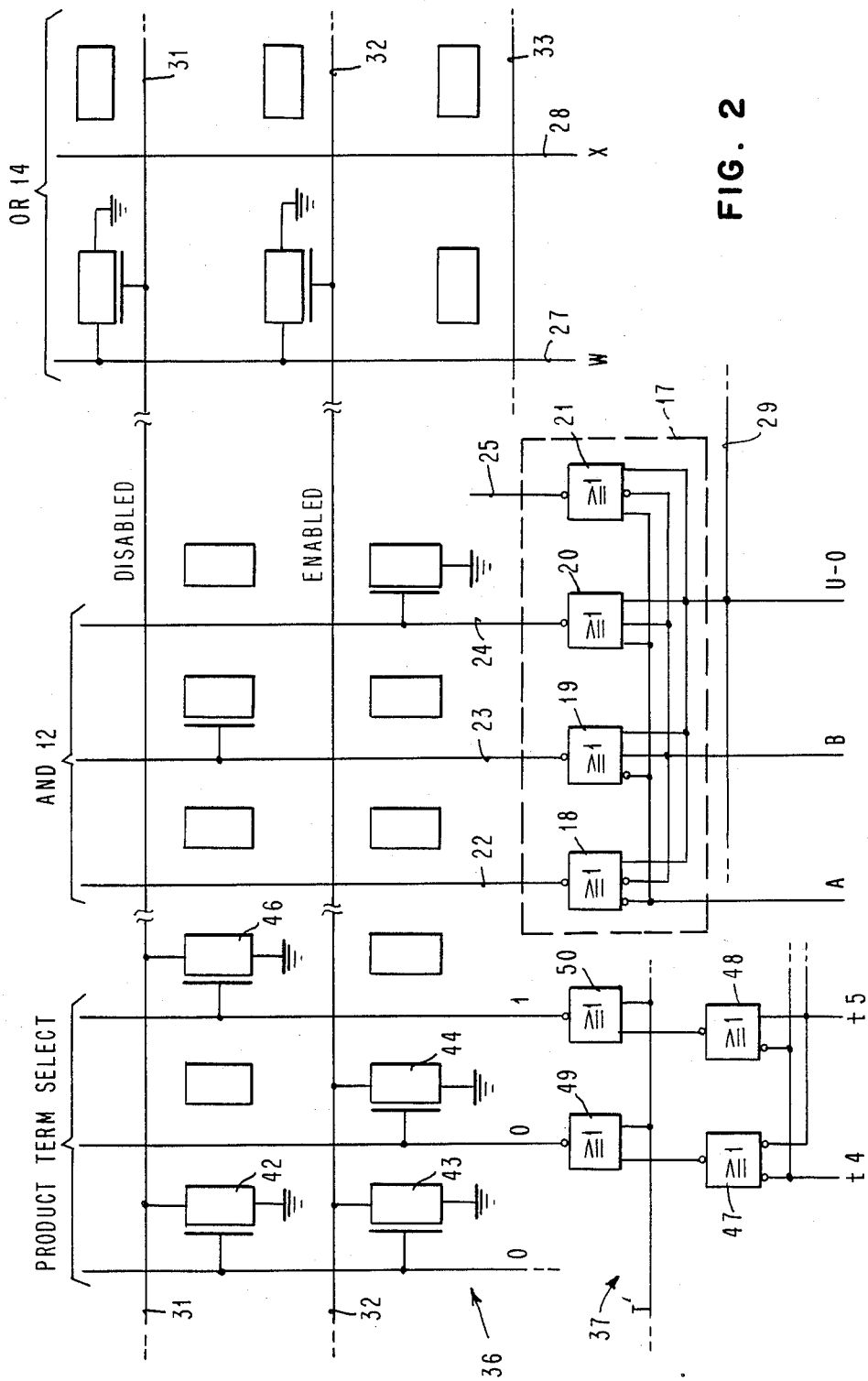
FIG. 2 is a circuit diagram of representative components of the PLA.

FIG. 1 shows in block form an AND array 12, an OR array 14, one bit or two-bit partioning circuits 15, and an output buffer 16. In FIG. 2, representative logic inputs A and B enter components 18–21 of decoder circuit 15, and a logic function of these inputs is applied to input lines 23, 24 and 25 that extend along columns of the AND array. The drawing also shows representative logic outputs W and X that are formed on output lines 27, 28 that extend along column lines in the OR array. Representative product term lines 31, 32 and 33 cross the column lines. (The orientation of the rows and columns of the array in the drawing is of course arbitrary but in this description "row" and "column" will be used as general, interchangeable terms for conductors that are arranged for selective interconnects at an array of points.)

As FIG. 2 shows, these column input and output lines are crossed in the array by representative row lines that are called product term lines because they each carry a logic function in the form of the logical product of the inputs. A circuit device is located at each crossover point and is made active to interconnect the crossing lines or is made inactive to isolate the row line and column line. Ordinarily a device is made active or inactive as part of the process of manufacturing the device and tests that are made during manufacturing determine whether there is a fault in these devices or related components.

In the drawing the device is a field effect transistor (FET). In the AND array an active device has its drain terminal connected to a product term line, its gate terminal connected to an input line, and its source terminal connected to ground. Similarly, an active device in the OR array has its drain terminal connected to an output line, its gate terminal connected to a product term line, and its source terminal connected to ground. An inactive device is shown in the drawing as a block without these connections.

Resistors (not shown) connect each array line separately to a positive potential point (+V) so that the product term lines are up unless an FET is turned on in the AND array, and an output line is up unless an FET is turned on in the OR array. In the OR array, an OR-Invert logic circuit is formed by a group of FETs that have their drain terminals connected to the same output line. An output line of the array forms the output of the OR-Invert circuit and where there are active devices along the output line, the product term lines carry the circuit inputs. In the AND array, a group of FETs that have their drain terminals connected to the same product term line also form an OR-Invert circuit with the circuit inputs from the array input lines and the output on the product term line. The AND array cooperates with circuits in decoder circuit 15, for example that invert the inputs to the array and thereby produce an overall logic function that simplifies algebraically to an AND logic function, but it will be helpful in some cases to consider the AND array at the point of detail where the function is in fact OR-Invert.

This simplified description of a specific PLA will suggest many other specific devices that can be modified to incorporate this invention.

3. The Two Bit Decoder 15

FIG. 2 shows representative components of one two-bit decoder circuit 17 of partitioning circuit 15. Circuit 15 has enough two-bit decoders to receive all of the AND array inputs. As is conventional, representative gates 18–21 receive two inputs, A and B, and produce the product terms A'B', A'B, AB, and AB'. Decoder 17 is shown with representative gates and with logical inverters that are represented as circles in the drawing. These conventional circuits are modified for segmenting the array, as will be described next.

Alternatively, one bit partitioning circuit receives an input (A) and produces its true and complement values (A and A') on two input lines. From a more general standpoint, there are gates on each of the input lines 22–25 of the array.

4. Segmenting the Input Lines

In the circuit of the drawing, an input line is disabled by giving it a down level that turns off the FETs along the line. If the AND array is considered as a set of OR-Invert gates, the down level is a non-controlling signal level. Conversely, a line is "enabled" to take an up or down level according to the binary value of its input. In this PLA the input lines are arranged to be enabled or disabled together in segments so that only a selected segment of the AND array responds to the input signals A, B. Segments are enabled randomly for testing the operations along the input lines a few lines at a time.

Gates in the two-bit decoders are modified to enable or disable the associated input lines to the AND array in response to control signals u-0 through u-3 that will be described later. In FIG. 2, gates 18–21 each receive the control signal u-0. The circuit modification will be readily understandable from the drawing. A line 29 carries signal u-0 to other decoders 17 in partitioning circuit 15.

It is an advantage of this feature of the invention that it can be partly combined with the conventional two-bit decoder circuit, but the function can be combined with other existing circuits or can be implemented independently. Various gating functions are well known, and this circuit function can be implemented in various ways. From a more general standpoint, gates 18–21 are gates for the input lines 22–25 without regard to the conventional partitioning function, but preferably all of the array lines associated with a decoder are controlled by the same control signal. There is no significance to the physical ordering of the segments within the array. Ordinarily, the segments will be made equal in size.

5. Segment Select Circuit 34

Signal u-0 and signals u-1 through u-3 are formed by a segment select circuit 34 in FIG. 1. Preferably, circuit 34 forms the four segment control signals u-0 by decoding two signals t1 and t2 ("test 1" and "test 2"). Circuit 34 is located on the device to be tested, and preferably signals t1 and t2 are formed by conventional random signal generating means that is also located on the device. Circuit 34 also receives a signal T that is given a 1 logic value for a test and a 0 logic value for normal operation. When signal T is active for testing, it enables circuit 34 to respond to signals t1 and t2 and to produce a 0 logic level signal on one of lines u-0 to u-3 and a 1 logic level on each of the three other control lines. When signal T is inactive, it controls circuit 34 to maintain all signals u-0 to u-3 at a 0 logic level. Preferably, as FIG. 2 shows, only one segment at a time is enabled for testing, but some of the other advantages of this invention can be achieved if combinations of segments or all of the segments are enabled together during a test.

Thus, circuit 34 has a complement decoder function, like components 18–21 in FIG. 2, combined with gating for the signal T which is similar to the gating function of the control signals. This logic function can be implemented directly from the following table or from an equivalent logic expression.

TABLE 1

$$u\text{-}0' = T' + t1't0'$$
$$u\text{-}1' = T' + t1't0$$
$$u\text{-}2' = T' + t1\,t0'$$

TABLE 1-continued $$u\text{-}4' = T' + t1\ t0$$

Other aspects of these components will be apparent from the later description of an operation to test the module.

6. Segmenting the Product Term Lines

Circuit blocks 36 and 37 in FIG. 1 control the product term lines so that one of these lines is enabled for a test and the others are held in a state where their operation cannot mask a fault on the product term line being tested. Random input signals t2–t5 are provided by conventional means (not shown) that is preferably part of the device being tested. The signal T1 introduced in the description of the segment select decode, is applied to block 37 to control the device for testing (T=1) or normal operation (T=0).

The PLA of the drawing has 16 representative product term lines. Considering blocks 37 and 38 as an addressing circuit for these lines, the four signals t2 through t5 provide an address that is sufficient to select only one of the product term lines for test and to disable the other fifteen lines. From a more general standpoint, one or a few product term lines are enabled randomly and the number is small enough to suitably test an array that may have multiple faults that otherwise might be masked during the test.

7. Circuit 36—FIG. 2

The sixteen product term lines of the AND array 12 extend into circuit 36 and the circuit 36 is constructed as an array like AND array 12 and OR array 14. There are eight column lines in this array which are controlled by circuit 36 as will be described later. Thus there are sixteen row lines and eight column lines. There is one FET at each crossover point of a row and column line as in the conventional arrays 12 and 14.

FIG. 1 shows a 1 where an FET in this array is made active. Notice that there are two active FETs in each row.

An up level on any six of the column lines disables the row lines where FIG. 1 shows a blank in the row and column. Two of the column lines carry down levels and in FIG. 1 the row line that is enabled has 1's in these two columns.

In the partial drawing of FIG. 2, legends on column lines 39–41 and row lines 31 and 32 illustrate disabling row 31 and enabling row 32. The pattern of active devices corresponds in FIG. 1 to rows three and four from the top and columns four and five from the left. In this example, column lines 39 and 40 carry 0 logic levels and active devices 42–43 along this line are not turned on. Line 41 and five other column lines not shown each carray a 1 and turn on any active device. Similarly, active device 44 at the intersection of column line 40 and row line 32 is not turned on. Since each row line has only two active devices, row 32 is enabled. An active device 46 is turned on at the intersection of row line 31 and column line 41 and pulls down row line 31 to a disabled level. All other row lines are similarly disabled.

8. Circuit 37—FIG. 2

Notice in FIG. 1 that the two 1's in each row are located in the right half and the left half of array 36. The column lines in array 36 are driven from two separate decoders of the type described already for circuit 34. One of these two decoder circuits receives signal T and random signals t2 and t3 and produces the signals for four column lines as already described, and one of these two decoder circuits receives signal T and random signals t4 and t5 and produces signals on the other four column lines. Notice that the polarities correspond to Table 1.

In FIG. 2, random signals t4 and t5 are decoded by gates 47, 48 and two similar gates not shown. Gates 49, 50 are controlled by signal T to hold lines 40, 41 at a down level when T=0 and to transmit the signals from gates 47, 48 when signal T is up.

9. Operation

For a test, signal T is raised by a control signal source that is external to the device. During a test, the random number generator forms a random number having digits t0–t5 and these signals are applied to the signal lines in the drawing and to a conventional coding circuit (not shown) that generates the expected test result. Other random signals are conventionally applied to the circuit inputs and the circuit outputs are conventionally applied to a coding circuit that generates a function of a long sequence of the circuit outputs. In response to these random signals, circuit 37 randomly enables two column lines in circuit 36 and circuit 36 randomly enables one product term line. Circuit 34 produces signals that randomly enable one of the four segments in the AND array. The number of circuit starts is substantially reduced and the random testing is made more effective.

Test signals A, B are produced by conventional coding apparatus such as a linear feedback shift register. Test signals to t5 are produced from the same apparatus, for example by additional shift register stages. Thus each test runs through the same sequence of test steps. If the device does not have a fault, it will reach a predetermined number of steps. As is conventional, this state is compared with a known state that is established by computer simulation of the device or by testing a number of devices and accepting a consistent result as valid and accepting varying results as invalid. As is also conventional, the state of the device can be established by compressing the sequence of signals that appear at test points of by sampling test points only at the end of the test.

From this description of a preferred embodiment of our invention, those skilled in the art will recognize many useful applications and suitable modifications within the spirit of the invention and the scope of the claims.

Having thus described our invention, what we claim as new, and desire to secure by Letters Patent is:

1. An array logic device of the type having first and second orthogonal sets of lines, means for applying input signals to the lines of the first set, circuit elements located at selected crossover points of the array to establish a pattern of interconnections from the first set to the second set, means for translating signals on the second set of lines to device output signals, means for generating a first plurality of random test signals and means for applying said test signals to said first lines, and means for detecting a function of the signal on said second lines during a test, wherein an improvement for self-testing the logic device comprises, means for supplying a second plurality of random signals, and means responsive to the second plurality of random signals for selectively enabling the lines of the first set in a plurality of segments during a test, and a second array having third and fourth orthogonal sets of lines, said fourth set of lines being formed as extensions of the lines of the second set, circuit elements at intersections of the third and extension lines in a pattern to disable a plurality of said second lines according to signals on said third lines, means for supplying a third plurality of random signals, and means responsive to said third plurality of random signals for forming signals on said third lines to disable a plurality of said second lines during a test, said second and third random signal means being arranged to cooperate with said first random signal means for stepping the device through a predetermined sequence of random test states, whereby after a predetermined number of steps the state of the device can be compared with the state of good device.

2. The device of claim 1 wherein said means for applying input signals to the lines of the first set includes gates in the lines of the first set and wherein said means for enabling the lines of the first set comprises means for decoding said second plurality of random signals to form a plurality of control signals and means connecting each of said control signals to a plurality of said gates to enable a segment of the lines of the first set.

3. The device of claim 2 wherein the device includes binary signal means defining a test operation or a normal operation and wherein said means for enabling the lines of the first set includes means connecting said gates to respond to said binary signal for enabling all of the lines of the first set for normal operation.

4. The device of claim 3 wherein said device includes a plurality of two-bit decoders comprising said gates and wherein said means connecting said control signals to said gates includes means connecting all of the gates of a two-bit decoder to receive the same control signal.

5. The device of claim 3 wherein the means responsive to said third plurality of random signals comprises means for decoding said third plurality of random signals and forming signals on said third lines to disable a plurality of said second lines.

6. The device of claim 5 wherein said circuit elements at said intersections of the third and extension lines are formed in a pattern to disable all but one of the second lines during a test.

7. The device of claim 6 wherein the means for decoding said third plurality of random signals comprises a plurality of two-bit decoders and wherein said circuit elements at said intersections of the third and extension lines are formed in a pattern to enable a line according to the occurance of a circuit element on a third line carrying a unique valued one of the four outputs of each two-bit decoder.

* * * * *